United States Patent
Su

(10) Patent No.: US 7,272,069 B2
(45) Date of Patent: Sep. 18, 2007

(54) MULTIPLE-CLOCK CONTROLLED LOGIC SIGNAL GENERATING CIRCUIT

(75) Inventor: Shu-Min Su, Hsin Chu (TW)

(73) Assignee: RDC Semiconductor Co., Ltd. (TW)

( * ) Notice: Subject to any disclaimer, the term of this patent is extended or adjusted under 35 U.S.C. 154(b) by 8 days.

(21) Appl. No.: 11/373,461

(22) Filed: Mar. 10, 2006

(65) Prior Publication Data

US 2007/0076466 A1     Apr. 5, 2007

(30) Foreign Application Priority Data

Oct. 3, 2005     (TW) .............................. 94134456 A

(51) Int. Cl.
G11C 8/00     (2006.01)
(52) U.S. Cl. ............ 365/233; 365/189.08; 365/189.12; 327/99; 327/298
(58) Field of Classification Search ................ 365/100, 365/189.08, 233, 189.12, 194, 230.05; 327/99, 327/298
See application file for complete search history.

(56) References Cited

U.S. PATENT DOCUMENTS

| 6,441,668 B1 * | 8/2002 | Miller ........................ 327/298 |
| 7,057,431 B2 * | 6/2006 | Kwak ........................ 327/158 |
| 2003/0133747 A1 * | 7/2003 | Chang ........................ 370/512 |

* cited by examiner

Primary Examiner—Richard T. Elms
Assistant Examiner—Hien Nguyen
(74) Attorney, Agent, or Firm—Peter F. Corless; Steven M. Jensen; Edwards Angell Palmer & Dodge LLP

(57) ABSTRACT

A multiple-clock controlled logic signal generating circuit is proposed, which is designed for use to generate a logic signal during specified periods with reference to multiple clock signals; and which is characterized by the use of a set of switching modules to switch between two different input signals and two different clock signals and the use of an S-R flip-flop unit to output either the first input signal or the second input signal during different specified periods. This feature allows the architecture of the proposed multiple-clock controlled logic signal generating circuit to be more simplified than prior art and thus easier to implement.

4 Claims, 2 Drawing Sheets

MULTIPLE-CLOCK CONTROLLED LOGIC SIGNAL GENERATING CIRCUIT

BACKGROUND OF THE INVENTION

1. Field of the Invention

This invention relates to digital electronics technology, and more particularly, to a multiple-clock controlled logic signal generating circuit which is designed for use to generate a logic signal during specified periods with reference to multiple clock signals.

2. Description of Related Art

In the design of logic circuitry, it is often needed to generate a pulse signal of a specified width that appears during a specified interval of time, so as to utilize this pulse signal to enable a certain logic state or to activate other logic modules to perform a certain task at a specified point of time. Fundamentally, the timing and duration of logic signals generated by a logic circuit is typically controlled with reference to clock signals.

In some particular applications of logic circuitry, however, it may require the utilization of two or more clock signals for controlling the timing and duration of a number of logic signals of different frequencies and lasting durations. In the design of this kind of logic circuitry, since the synchronizations and interrelations between the various signals are typically highly complicated, it would require the use of a complex circuit architecture comprising a large number of registers, flip-flops, and various other logic components, and is thus difficult to implement.

SUMMARY OF THE INVENTION

It is therefore an objective of this invention to provide a multiple-clock controlled logic signal generating circuit which can be implemented by using a circuit architecture that is much less complicated than the prior art to provide a multiple-clock controlled logic signal generating function.

In architecture, the multiple-clock controlled logic signal generating circuit according to the invention comprises: (a) a first switching module, which has a first input port, a second input port, an output port, and a control port; and whose first input port is connected to receive a first input signal, whose second input port is connected to receive a second input signal, and whose control port is connected to receive a switching control signal for selectively switching the connection of the output port between the first input port and the second input port for the purpose of outputting a selected one of the first input signal and the second input signal; (b) a second switching module, which has a first input port, a second input port, an output port, and a control port; and whose first input port is connected to receive a first clock signal, whose second input port is connected to receive a second clock signal, and whose control port is connected to receive the same switching control signal that is linked to the control port of the first switching module for selectively switching the connection of the output port between the first input port and the second input port for the purpose of outputting a selected one of the first clock signal and the second clock signal; and (c) a flip-flop module, which has an input port, a triggering port, and an output port; and whose input port is connected to the output port of the first switching module, whose triggering port is connected to the output port of the second switching module, and whose output port is used to output a selected one of the first input signal and the second input signal.

The multiple-clock controlled logic signal generating circuit according to the invention is characterized by the use of a set of switching modules to switch between two different input signals and two different clock signals and the use of an S-R flip-flop module to output either the first input signal or the second input signal during different specified periods. This feature allows the architecture of the proposed multiple-clock controlled logic signal generating circuit to be more simplified than prior art and thus easier to implement.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The multiple-clock controlled logic signal generating circuit according to the invention is disclosed in full details by way of preferred embodiments in the following with reference to the accompanying drawings.

Figure 1:
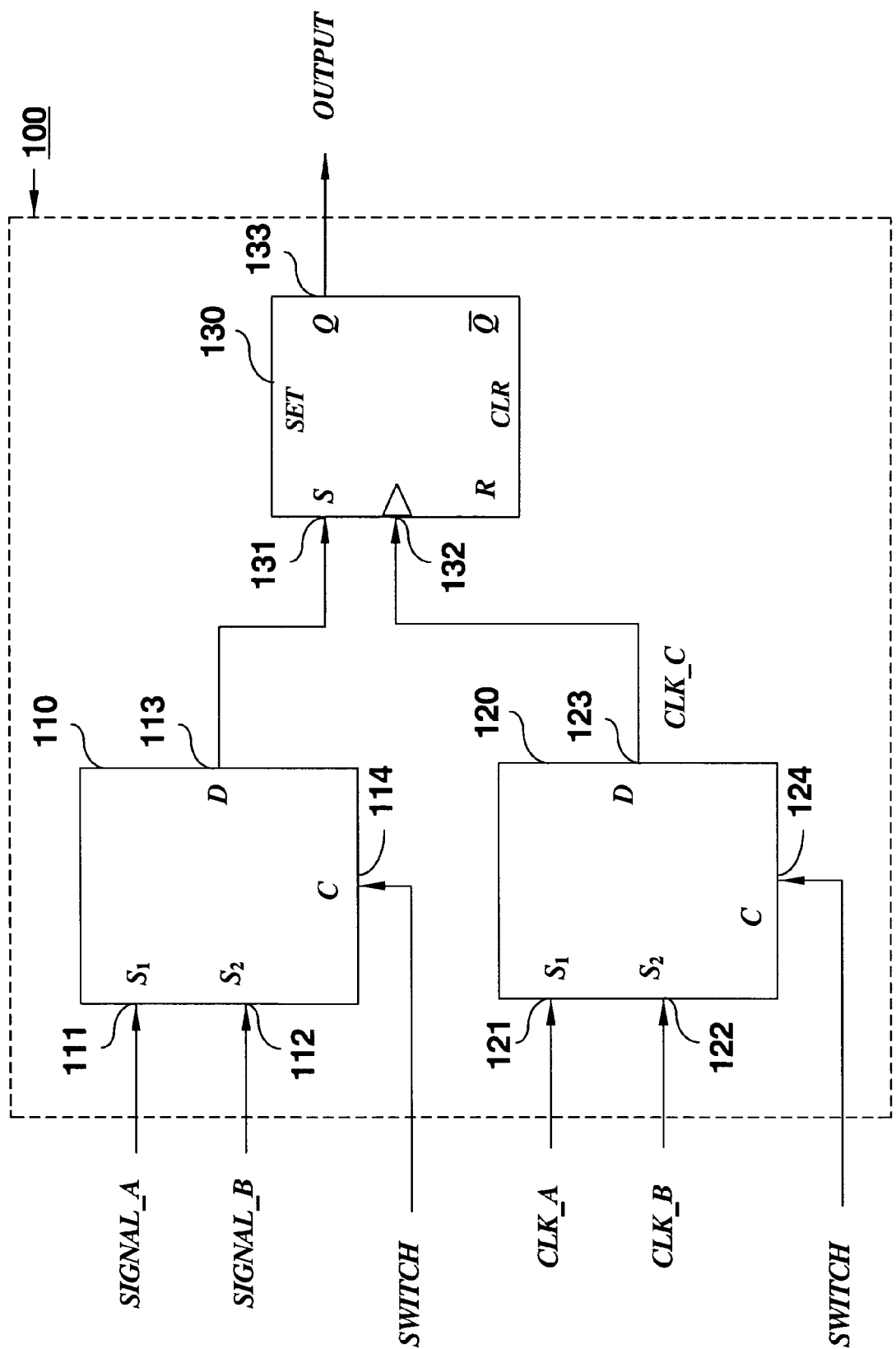
FIG. 1 is a schematic diagram showing the circuit architecture of the multiple-clock controlled logic signal generating circuit according to the invention.

FIG. 1 is a schematic diagram showing the circuit architecture of the multiple-clock controlled logic signal generating circuit of the invention 100, which comprises: (a) a first switching module 110; (b) a second switching module 120; and (c) an S-R flip-flop module 130.

Figure 2:
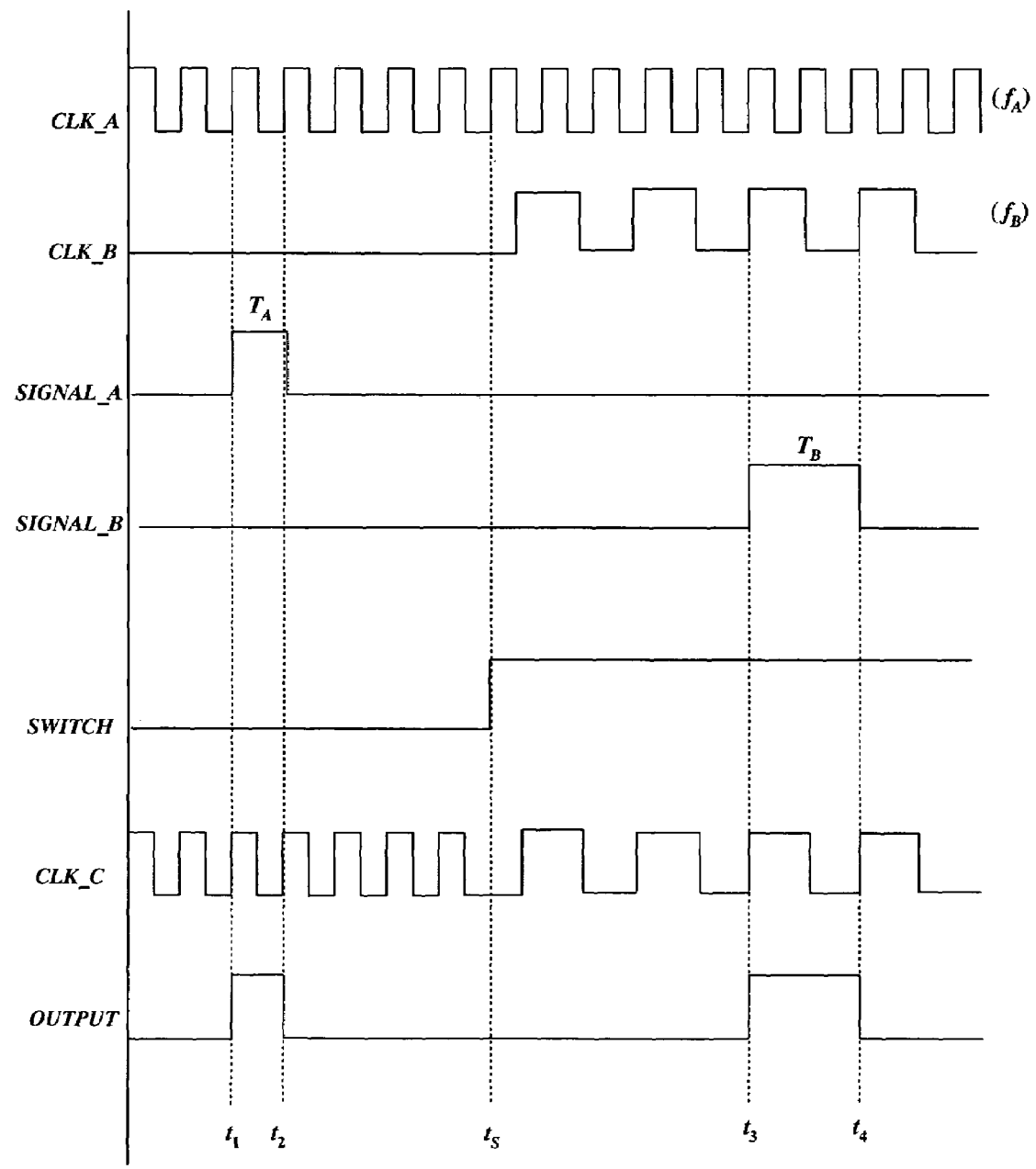
FIG. 2 is a signal diagram showing the waveform and sequencing of various signals that are processed by the multiple-clock controlled logic signal generating circuit according to the invention.

The first switching module 110 has a first input port 111, a second input port 112, an output port 113, and a control port 114; and whose first input port 111 is connected to receive a first input signal SIGNAL_A, whose second input port 112 is. connected to receive a second input signal SIGNAL_B, and whose control port 114 is connected to receive a switching control signal SWITCH. During operation, the first switching module 110 is controlled by the switching control signal SWITCH for selectively switching the connection of its output port 113 between the first input port 111 and the second input port 112 for the purpose of outputting a selected one of the first input signal SIGNAL_A and the second input signal SIGNAL_B. In practical implementation, for example, the first switching module 110 is designed to operate in such a manner that when the switching control signal SWITCH is at logic-LOW state, it will connect its output port 113 to the first input port 111 such that the output port 113 will output the first input signal SIGNAL_A; and when the switching control signal SWITCH is at logic-HIGH state, it will connect its output port 113 to the first input port 111 such that the output port 113 will output the second input signal SIGNAL_B. FIG. 2 shows an example of the waveform and sequencing of the first input signal SIGNAL_A, the second input signal SIGNAL_B, and the switching control signal SWITCH.

The second switching module 120 has a first input port 121, a second input port 122, an output port 123, and a control port 124; and whose first input port 121 is connected to receive a first clock signal CLK_A, whose second input port 122 is connected to receive a second clock signal CLK_B, and whose control port 124 is connected to receive the same switching control signal SWITCH that is linked to the control port 114 of the first switching module 110. During operation, the second switching module 120 is controlled by the switching control signal SWITCH for selectively switching the connection of its output port 123 between the first input port 121 and the second input port 122 for the purpose of outputting a selected one of the first clock signal CLK_A and the second clock signal CLK_B. In practical implementation, for example, the second switching module 120 is designed to operate in such a manner that when the switching control signal SWITCH is at logic-LOW state, it will connect its output port 123 to the first input port 121 such that the output port 123 will output the first clock signal CLK_A; and when the switching control signal SWITCH is at logic-HIGH state, it will connect its output port 123 to the first input port 121 such that the output port 123 will output the second clock signal CLK_B. FIG. 2 shows an example of the waveform and sequencing of the first clock signal CLK_A, the second clock signal CLK_B, the output clock signal CLK_C from the second switching module 120, and the switching control signal SWITCH.

The flip-flop unit 130 has an input port 131, a triggering port 132, and an output port 133; and whose input port 131 is connected to the output port 113 of the first switching module 110, and whose triggering port 132 is connected to the output port 123 of the second switching module 120. During operation, when the switching control signal SWITCH is at logic-LOW state, the input port 131 of the S-R flip-flop unit 130 will receive the first input signal SIGNAL_A from the first switching module 110 while its triggering port 132 will receive the first clock signal CLK_A from the second switching module 120. On the other hand, when the switching control signal SWITCH is at logic-HIGH state, the input port 131 of the S-R flip-flop unit 130 will receive the second input signal SIGNAL_B from the first switching module 110 while its triggering port 132 will receive the second clock signal CLK_B from the second switching module 120.

Referring to FIG. 1 together with FIG. 2, when the multiple-clock controlled logic signal generating circuit of the invention 100 is started to operate, the first clock signal CLK_A received by the second switching module 120 is a clock signal of frequency $f_A$ as illustrated in FIG. 2, and meanwhile the second clock signal CLK_B is null. At this time, the switching control signal SWITCH is at logic-LOW state, and as a result, it will cause the second switching module 120 to select the first clock signal CLK_A as its output clock signal CLK_C and transfer the output clock signal CLK_C to the triggering port 132 of the S-R flip-flop unit 130. At the temporal point $t_1$, the first input signal SIGNAL_A received by the first switching module 110 is a square pulse signal of width $T_A$ as illustrated in FIG. 2, and meanwhile the second clock signal CLK_B is null (i.e., at logic-LOW state). Since the switching control signal SWITCH is at logic-LOW state at this time, it will cause the first switching module 110 to select the first input signal SIGNAL_A as its output and transfer the output signal to the input port 131 of the S-R flip-flop unit 130. Since the switching control signal SWITCH remains at logic-LOW state during the period before the temporal point $t_s$, it will cause the output port 133 of the S-R flip-flop unit 130 to output the first input signal SIGNAL_A as illustrated in FIG. 2.

At the temporal point $t_s$, the switching control signal SWITCH is changed to logic-HIGH state, and subsequently the second clock signal CLK_B is changed from null to present a pulse train of frequency $f_B$ as illustrated in FIG. 2. Since the switching control signal SWITCH is changed from logic-LOW state to logic-HIGH state, it will cause the second switching module 120 to alternatively select the second clock signal CLK_B as its output clock signal CLK_C and transfer the output clock signal CLK_C to the triggering port 132 of the S-R flip-flop unit 130, and meanwhile cause the first switching module 110 to select the second input signal SIGNAL_B as its output and transfer the output signal to the input port 131 of the S-R flip-flop unit 130. After the temporal point $t_s$, the second input signal SIGNAL_B received by the first switching module 110 is a square pulse signal of width $T_B$ as illustrated in FIG. 2. It is to be noted that, as shown in FIG. 2, when the switching control signal SWITCH is changed from logic-LOW state to logic-HIGH state (i.e., when CLK_C=CLK_B), the second input signal SIGNAL_B should be presented after the appearance of two pulses of the second clock signal CLK_B (i.e., in synchronization with the third pulse of the second clock signal CLK_B). Since the switching control signal SWITCH remains at logic-HIGH state after the temporal point $t_s$, it will cause the output port 133 of the S-R flip-flop unit 130 to generate an output signal OUTPUT equal to the second input signal SIGNAL_B as illustrated in FIG. 2. This allows the S-R flip-flop unit 130 to selectively output either the first input signal SIGNAL_A or the second input signal SIGNAL_B during different intervals of time; i.e., the first input signal SIGNAL_A during the interval from $t_1$ to $t_2$, and the second input signal SIGNAL_B during the interval from $t_3$ to $t_4$.

If it is desired to switch the output signal OUTPUT of the S-R flip-flop unit 130 from the second input signal SIGNAL_B back to the first input signal SIGNAL_A, it can be easily realized by changing the switching control signal SWITCH from logic-HIGH state to logic-LOW state. It is also to be noted that when the switching control signal SWITCH is changed from logic-HIGH state to logic-LOW state (i.e., when CLK_C=CLK_A), the first input signal SIGNAL_A should be presented after the appearance of two pulses of the first clock signal $CLK_{13}$ A (i.e., in synchronization with the third pulse of the first clock signal CLK_A).

In conclusion, the invention provides a multiple-clock controlled logic signal generating circuit which is designed for use to generate a logic signal during specified periods with reference to multiple clock signals; and which is characterized by the use of a set of switching modules to switch between two different input signals and two different clock signals and the use of an S-R flip-flop unit to output either the first input signal or the second input signal during different specified periods. This feature allows the architecture of the proposed multiple-clock controlled logic signal generating circuit to be more simplified than prior art and thus easier to implement. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A multiple-clock controlled logic signal generating circuit, which comprises:

a first switching module, which has a first input port, a second input port, an output port, and a control port;

and whose first input port is connected to receive a first input signal, whose second input port is connected to receive a second input signal, and whose control port is connected to receive a switching control signal for selectively switching the connection of the output port between the first input port and the second input port for the purpose of outputting a selected one of the first input signal and the second input signal;

a second switching module, which has a first input port, a second input port, an output port, and a control port; and whose first input port is connected to receive a first clock signal, whose second input port is connected to receive a second clock signal, and whose control port is connected to receive the same switching control signal that is linked to the control port of the first switching module for selectively switching the connection of the output port between the first input port and the second input port for the purpose of outputting a selected one of the first clock signal and the second clock signal; and a flip-flop unit, which has an input port, a triggering port, and an output port; and whose input port is connected to the output port of the first switching module, whose triggering port is connected to the output port of the second switching module, and whose output port is used to output a selected one of the first input signal and the second input signal.

2. The multiple-clock controlled logic signal generating circuit of claim 1, wherein the flip-flop unit is an S-R type flip-flop unit.

3. The multiple-clock controlled logic signal generating circuit of claim 1, wherein when the switching control signal is changed in logic state to control the switching of the first switching module and the second switching module to take the second clock signal, the second input signal is presented after the appearance of at least two pulses of the second clock signal.

4. The multiple-clock controlled logic signal generating circuit of claim 1, wherein when the switching control signal is changed in logic state to control the switching of the first switching module and the second switching module to take the first clock signal, the first input signal is presented after the appearance of at least two pulses of the first clock signal.

* * * * *

UNITED STATES PATENT AND TRADEMARK OFFICE
CERTIFICATE OF CORRECTION

| | | |
|---|---|---|
| PATENT NO. | : 7,272,069 B2 | |
| APPLICATION NO. | : 11/373461 | |
| DATED | : September 18, 2007 | |
| INVENTOR(S) | : Shu-Min Liu | |

It is certified that error appears in the above-identified patent and that said Letters Patent is hereby corrected as shown below:

On the Title Page, Item (75), the inventor's name Shu-Min Su" should read:
--Shu-Min Liu--.

Signed and Sealed this
Twenty-ninth Day of March, 2011

David J. Kappos
*Director of the United States Patent and Trademark Office*